(12) United States Patent
Lee et al.

(10) Patent No.: US 7,101,803 B2
(45) Date of Patent: Sep. 5, 2006

(54) METHOD OF TRENCH ISOLATION AND METHOD FOR MANUFACTURING A NON-VOLATILE MEMORY DEVICE USING THE SAME

(75) Inventors: Sang-Hoon Lee, Uiwang-si (KR); Hun-Hyeoung Leam, Yongin-si (KR); Seung-Mok Shin, Suwon-si (KR); Woo-Sung Lee, Yongin-si (KR)

(73) Assignee: Samsung Electronics, Co., Ltd., (KR)

( * ) Notice: Subject to any disclaimer, the term of this patent is extended or adjusted under 35 U.S.C. 154(b) by 218 days.

(21) Appl. No.: 10/784,326

(22) Filed: Feb. 23, 2004

(65) Prior Publication Data
US 2004/0182815 A1 Sep. 23, 2004

(30) Foreign Application Priority Data
Mar. 17, 2003 (KR) .................... 10-2003-0016484

(51) Int. Cl.
H01L 21/311 (2006.01)
(52) U.S. Cl. ...................................... 438/700; 438/723
(58) Field of Classification Search ................ 438/700, 438/706, 719, 720, 723, 724, 221, 296, 427
See application file for complete search history.

(56) References Cited

U.S. PATENT DOCUMENTS

| | | | |
|---|---|---|---|
| 5,780,346 A | 7/1998 | Arghavani et al. | 438/296 |
| 6,013,551 A | 1/2000 | Chen et al. | 438/264 |
| 6,228,695 B1 * | 5/2001 | Hsieh et al. | 438/201 |
| 6,548,374 B1 * | 4/2003 | Chung | 438/424 |
| 6,620,681 B1 * | 9/2003 | Kim et al. | 438/257 |
| 2002/0019113 A1 * | 2/2002 | Chung | 438/424 |
| 2002/0072197 A1 * | 6/2002 | Kang et al. | 438/424 |
| 2002/0197823 A1 * | 12/2002 | Yoo et al. | 438/424 |

FOREIGN PATENT DOCUMENTS

| | | |
|---|---|---|
| KR | 2002-0002603 | 1/2002 |
| KR | 2003-0021011 | 3/2003 |

* cited by examiner

*Primary Examiner*—Kin-Chan Chen
(74) *Attorney, Agent, or Firm*—Mills & Onello LLP

(57) ABSTRACT

In accordance with a method of trench isolation, a first oxide layer is formed on a semiconductor substrate. A first conductive layer and a nitride layer are successively formed on the first oxide layer. The nitride layer, the first conductive layer and the first oxide layer are etched to form a nitride layer pattern, a first conductive layer pattern and an oxide layer pattern. A portion of the substrate adjacent to the first conductive layer pattern is etched to form a trench in the substrate. The trench is cured under dinitrogen monoxide ($N_2O$) or nitrogen monoxide(NO) atmosphere. A second oxide layer is formed in the trench through an in-situ process.

21 Claims, 14 Drawing Sheets

METHOD OF TRENCH ISOLATION AND METHOD FOR MANUFACTURING A NON-VOLATILE MEMORY DEVICE USING THE SAME

CROSS REFERENCE TO RELATED APPLICATION

This application claims priority under 35 USC § 119 to Korean Patent Application 2003-16484, filed on Mar. 17, 2003, the contents of which are herein incorporated by reference in their entirety for all purposes.

BACKGROUND OF THE INVENTION

1. Field of the Invention

The present invention relates to a method of trench isolation and a method for manufacturing a non-volatile memory device using the same. More particularly, the present invention relates to a method of shallow trench isolation capable of preventing a semiconductor device from deteriorating during formation of a trench and simplifying fabricating processes of the semiconductor device, and to a method for manufacturing a non-volatile memory device using the same.

2. Description of the Related Art

In fabrication of highly-integrated memory devices, integration degree of a memory cell is generally determined according to layout of the memory cell and scalability of the layout proportional to reduction of critical dimension (CD) of the memory cell. As the CD is reduced below sub-micron, the scalability of the layout is restricted by resolution of the semiconductor fabricating process and alignment tolerances of masks for the design. The alignment of the mask is restricted by technologies for positioning the mask over a wafer and for consistently forming a pattern on the mask. When the alignment tolerances are accumulated, the layout of the memory cell may be mis-aligned. Accordingly, to reduce the alignment tolerances in design of the memory cell, it is preferable to use a smallest number of alignment critical masks.

Most highly-integrated memory cells are designed for isolating cells arrayed in a column direction in a cell array. To increase the integration degree of the memory cell, it is preferable to minimize dimensions of isolation structures. However, the dimensions of the isolation structures are restricted by processes for forming the isolation structure and by structures of the memory cell array.

Typically, the isolation structure is formed through a thermal field oxidation process, for example, such as a local oxidation of silicon (LOCOS). In accordance with the LOCOS, an oxide layer and a nitride layer are formed on a silicon substrate. The nitride layer is patterned to form a nitride layer pattern. The silicon substrate is partially oxidized using the nitride layer pattern as an oxidation preventing mask to form a field oxide layer on the substrate. In this process, oxygen penetrates from a lower portion of the nitride layer pattern into a side surface of the oxide layer so that a bird's beak is formed on an end portion of the field oxide layer. The field oxide layer is extended toward an active region by a length of the bird's beak. As a result, a width of the active region is reduced, thereby deteriorating electrical characteristics of the semiconductor device.

To solve the above problem caused by the bird's beak, a method of a shallow trench isolation (STI) is disclosed. In accordance with the STI method, a silicon substrate is etched to form a trench in the silicon substrate. An oxide layer is formed on the substrate to fill the trench with the oxide layer. The oxide layer is etched through an etch-back process or a chemical mechanical polishing (CMP) process to form a field oxide layer in the trench.

The LOCOS process and the STI process include forming the mask and forming the field oxide layer for defining the active region. After the isolation structure is formed on the substrate, processes for forming the memory cells using masks are performed. Since the alignment tolerances accompanying the formation of the isolation structure and the layout of the memory cell are combined, the mis-alignment disadvantageously occurs on the semiconductor device.

To prevent the mis-alignment, a conventional method for forming an isolation structure according to the LOCOS process on a floating gate through a self-align process in a non-volatile memory device is disclosed. A conventional method for forming an isolation structure according to the STI process on a floating gate through a self-align process is also disclosed in U.S. Pat. Publication No. 6,013,551. According to the above conventional methods, the floating gate used for storing an electric charge and the gate region are defined using one mask so that the isolation structure is provided between the active region and the floating gate through the self-align process.

When data is inputted into the non-volatile memory device, the data in the non-volatile memory device is generally maintained as it is regardless of lapse of time. Recently, there is a high demand for a flash memory device into which a data is electrically input and from which a data is electrically output. A memory cell of the flash memory device storing the data includes a floating gate formed on a tunnel oxide layer that is formed on a silicon substrate, and a control gate formed on an insulating interlayer that is formed on the floating gate. An input/output of the data in the flash memory device is performed through providing/extracting the electric charge into/from the floating gate by applying a voltage to the control gate and the substrate. Here, the insulating interlayer keeps the electric charge in the floating gate and transmits the voltage applied to the control gate into the floating gate.

FIGS. 1A to 1G are perspective views illustrating a conventional method for manufacturing a flash memory device using a STI process.

Referring to FIG. 1A, an oxide layer 11 is formed on a silicon substrate 10. A first polysilicon layer 13 and a nitride layer 15 are successively formed on the oxide layer 11. Here, the oxide layer 11 serves as a gate oxide layer of a flash memory cell, that is, a tunnel oxide layer. The first polysilicon layer 13 serves as a floating gate. The nitride layer 15 serves as a polishing stop layer.

Referring to FIG. 1B, the nitride layer 15, the first polysilicon layer 13 and the oxide layer 11 are etched using a photoresist pattern (not shown) as a mask to form a nitride layer pattern 16, a first polysilicon layer pattern 14 and an oxide layer pattern 12. An upper portion of the substrate 10 adjacent to the first polysilicon pattern 14 is etched using the photoresist pattern as a mask to form a trench 18. An active region is defined on the substrate 10, and a floating gate is simultaneously formed on the substrate 10 using one mask.

Referring to FIG. 1C, to cure damage of the silicon substrate 10 caused by high energy of ion impact during the etching process and to suppress leakage current at the vicinity of the trench 18, a portion exposed through the trench 18 is thermally treated under oxygen atmosphere. A thermal oxide layer 20 is formed on a bottom and a sidewall of the trench 18 by reacting oxygen with silicon. Here, the thermal treating process is performed at a temperature of about 820° C. for about 3 hours to about 3.5 hours. An inner wall of the trench 18 is annealed at a temperature of about 850° C. under dinitrogen monoxide ($N_2O$) or nitrogen monoxide (NO) atmosphere.

FIG. 2 is an enlarged sectional view of the portion labeled 'D' in FIG. 1C. With reference to FIG. 2, oxygen penetrates from the lower portion of the first polysilicon pattern 14 into the side surface of the oxide layer pattern 12 during the oxidation process so that a bird's beak A is formed on the first polysilicon pattern 14. Further, the oxide layer pattern 12 is expanded during the oxidation process. However, the expansion of the oxide layer pattern 12 is restricted at interface edges between the first polysilicon layer pattern 14 and the oxide layer pattern 12 and between the silicon substrate 10 and the oxide layer pattern 12. Thus, stresses caused from the expansion of the oxide layer pattern 14 are concentrated on the interface edges so that oxygen is slowly diffused, thereby suppressing the oxidation (see 'B' portion of FIG. 2). As a result, a bottom edge of the first polysilicon layer pattern 14 is bent upwardly so that the sidewall of the first polysilicon pattern 14 has a positive slope (see 'C' portion of FIG. 2). Here, the positive slope represents that the sidewall of the first polysilicon pattern 14 may be eroded by an etchant. On the contrary, since penetration of oxygen into an upper portion of the first polysilicon pattern 14 is restricted by the nitride layer pattern 16, the upper portion of the first polysilicon pattern 14 has a negative slope.

Referring again to FIG. 1C, a medium temperature oxide layer 30 is formed on the trench 18 and the nitride layer pattern 16 through a process using a silane ($SiH_4$) gas and a dinitrogen monoxide ($N_2O$) gas at a temperature of about 750° C. for about 4 hours. The medium temperature oxide layer 30 prevents the trench 18 and the nitride layer pattern 16 from being damaged by plasma during a gap filling process.

Referring to FIG. 1D, an oxide layer 21 is formed on the resultant structure through a chemical vapor deposition (CVD) process to fill the trench 18 with the oxide layer 21.

Referring to FIG. 1E, the oxide layer 21 is removed to expose the upper surface of the first polysilicon layer pattern 14 through the CMP process to form a field oxide layer 22 defining the active region in the trench 18. A second polysilicon layer (not shown) used as a floating gate is formed on the first polysilicon layer pattern 14 and the field oxide layer 22. The second polysilicon layer is contacted with the first polysilicon layer pattern 14 to broaden an area of dielectric layer 26 (see FIG. 1F).

Referring to FIG. 1F, the second polysilicon layer on the field oxide layer 22 is patterned through a photolithography process to form a second polysilicon layer pattern 24 on the first polysilicon layer pattern 14. The dielectric layer 26 and a control gate layer 28 are formed on the resultant structure. The control gate layer 28 has a stacked polycide structure having a doped polysilicon layer and a tungsten silicide layer.

Referring to FIG. 1G, the control gate layer 28 is patterned through the photo lithography process. The dielectric layer 26, the second polysilicon layer pattern 24 and the first polysilicon layer pattern 14 are dry etched. A stacked gate structure that includes the floating gate 25 having the first and second polysilicon layer patterns 14 and 24, and the control gate 28, is formed on the memory cell region.

However, as shown in the 'E' portion of FIG. 1F, since the lower portion of the sidewall of the first polysilicon layer pattern 14 has the positive slope, a portion of the first polysilicon layer pattern 14 being masked with the field oxide layer 22 may be not etched during the dry etching process, but rather it may remain. The residue of the first polysilicon layer pattern 14 is formed in a line at an intersection of the first polysilicon layer pattern 14, the field oxide layer 22 and the substrate 10 along a surface boundary between the field oxide layer 22 and the active region. The residue of the first polysilicon layer pattern 14 may serve as a bridge connected between the adjacent floating gates 25, thereby inducing electrical failure of the semiconductor device.

Additionally, a time greater than or equal to about seven hours may be required for forming the thermal oxide layer 20 and the medium temperature oxide layer 30. Furthermore, the substrate may be transferred between various chambers to perform the above processes. Therefore, the semiconductor fabricating processes may be complicated and also the cost for fabricating the semiconductor device may be high.

SUMMARY OF THE INVENTION

The present invention provides a method of trench isolation capable of preventing electrical failure of a semiconductor device and for simplifying processes for fabricating the semiconductor device.

The present invention provides a method for manufacturing a non-volatile memory device capable of reducing cost and time for fabricating a semiconductor device by preventing electrical failure of the semiconductor device and by simplifying processes for fabricating the semiconductor device.

In accordance with a method of trench isolation according to one aspect of the present invention, a first oxide layer is formed on a semiconductor substrate. A first conductive layer and a nitride layer are successively formed on the first oxide layer. The nitride layer, the first conductive layer and the first oxide layer are etched to form a nitride layer pattern, a first conductive layer patter and an oxide layer pattern. A portion of the substrate adjacent to the first conductive layer pattern is etched to form a trench in the substrate. The trench is cured using a compound that includes nitrogen. A second oxide layer is formed on a bottom and a sidewall of the trench. The trench is filled with a field oxide layer.

In one embodiment, the trench is annealed at a high temperature of above about 800° C. The field oxide layer can be formed through an in-situ process at a temperature of about 700° C. to about 800° C.

In one embodiment, the trench is formed through a self-alignment process using the nitride layer pattern as a mask. The first conductive layer pattern and the oxide layer pattern can be formed using the nitride layer pattern as the mask. In one embodiment, the compound includes dinitrogen monoxide ($N_2O$) or nitrogen monoxide (NO). The second oxide layer can be formed through an in-situ process. The second oxide layer can be formed at a temperature of about 700° C. to about 800° C.

The second oxide layer can include medium temperature oxide. In one embodiment, the second oxide layer has a thickness of about 140 Å to about 160 Å. In one embodiment, forming the field oxide layer comprises forming a third oxide layer to fill up the trench and to cover the nitride layer pattern, and planarizing the third oxide layer through a chemical mechanical polishing (CMP) process or an etch-back process to expose an upper face of the nitride layer pattern. In one embodiment, the third oxide layer includes borophosphosilicate glass (BPSG), ozone-tetraethylorthosilicate ($O_3$-TEOS), undoped silicate glass (USG) or high density plasma (HDP) oxide.

In accordance with a method for manufacturing a non-volatile memory device according to one aspect of the present invention, a first oxide layer is formed on a semiconductor substrate. A first conductive layer is formed on the first oxide layer. A nitride layer is formed on the first conductive layer. The nitride layer, the first conductive layer and the first oxide layer are etched to form a nitride layer pattern, a first conductive layer pattern and an oxide layer pattern. A portion of the substrate adjacent to the first conductive layer pattern is etched using the nitride layer pattern as a mask to form a trench in the substrate. The trench is cured using a compound including nitrogen. A second oxide layer is formed on a bottom and a sidewall of the trench through an in-situ process. A third oxide layer is formed on the nitride layer pattern to fill the trench with the third oxide layer. The third oxide layer is removed to form a field oxide layer in the trench. A second conductive layer pattern is formed on the first conductive layer pattern. An oxide/nitride/oxide layer and a third conductive layer are successively formed on the second conductive layer pattern.

In one embodiment, the trench is formed through a self-alignment process using the nitride layer pattern as a mask. The compound includes dinitrogen monoxide ($N_2O$) or nitrogen monoxide (NO). Curing the trench can be performed through an annealing process at a temperature of above about 800° C.

In one embodiment, the second oxide layer having a thickness of about 140 Å to about 160 Å includes medium temperature oxide. The second oxide layer can be formed at a temperature of about 700° C. to about 800° C.

In one embodiment, the first and second conductive patterns correspond to a floating gate, and the third conductive layer corresponds to a control gate.

In one embodiment, prior to forming the second conductive layer pattern, the third oxide layer is planarized through an etch-back process or a chemical mechanical polishing (CMP) process to expose an upper face of the nitride layer pattern, and the nitride layer pattern is selectively removed to expose an upper face of the first conductive layer pattern.

In one embodiment, prior to forming the second conductive layer pattern, the third oxide layer is planarized through an etch-back process or a chemical mechanical polishing (CMP) process to expose an upper face of the first conductive layer pattern.

In one embodiment, the third oxide layer includes BPSG, $O_3$-TEOS, USG or high density plasma (HDP) oxide.

According to the present invention, since the trench is annealed under dinitrogen monoxide ($N_2O$) or nitrogen monoxide (NO) atmosphere and then the oxide layer including a medium temperature oxide is formed in the trench through the in-situ process without forming a thermal oxide layer in the trench, a defect such as a bird's beak does not occur. Further, since the process for forming the thermal oxide layer may be omitted while the trench annealing process and the oxide layer forming process are performed as the in-situ process, time for fabricating the semiconductor device is remarkably reduced.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENTS

Hereinafter, a method of trench isolation and a method for manufacturing a non-volatile memory device according to one embodiment of the present invention are illustrated in detail.

FIGS. 3A to 3H are perspective views illustrating a method of trench isolation and a method for manufacturing a non-volatile memory device according to one embodiment of the present invention.

Figure 1A:
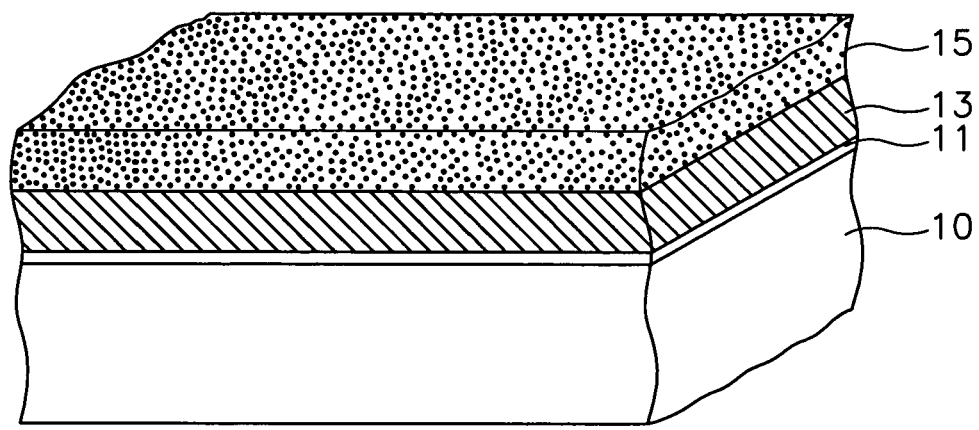
FIGS. 1A to 1G are perspective views illustrating a method for manufacturing a flash memory device according to a conventional shallow trench isolation process.
Figure 1B:
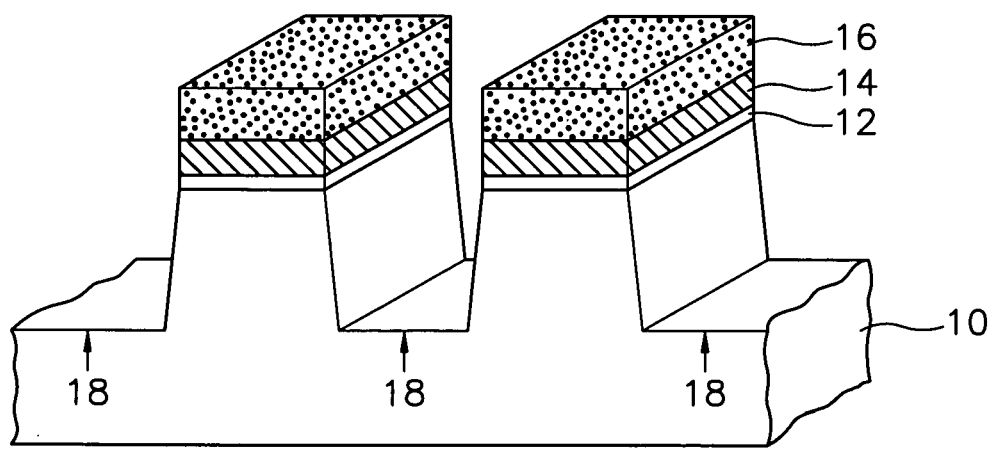
Figure 1C:
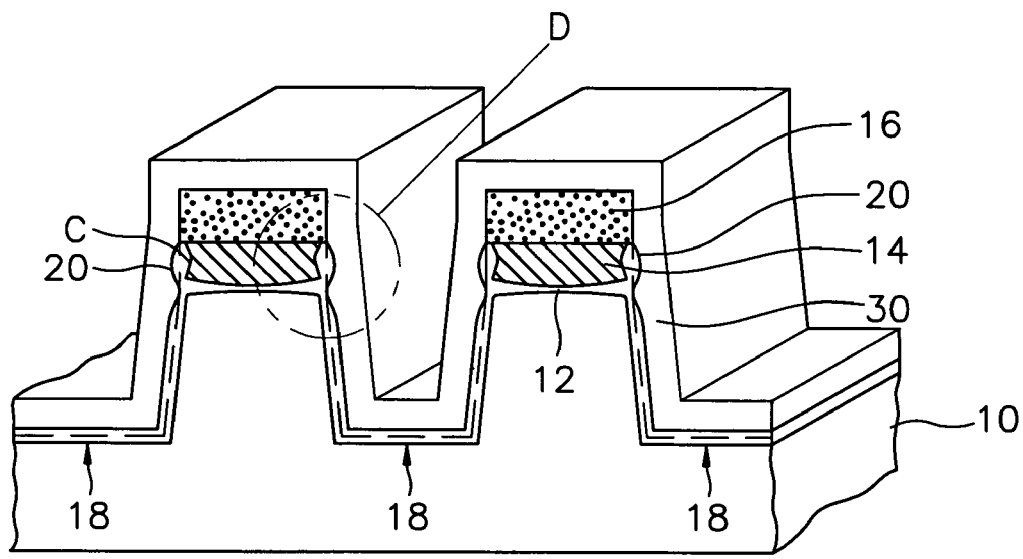
Figure 1D:
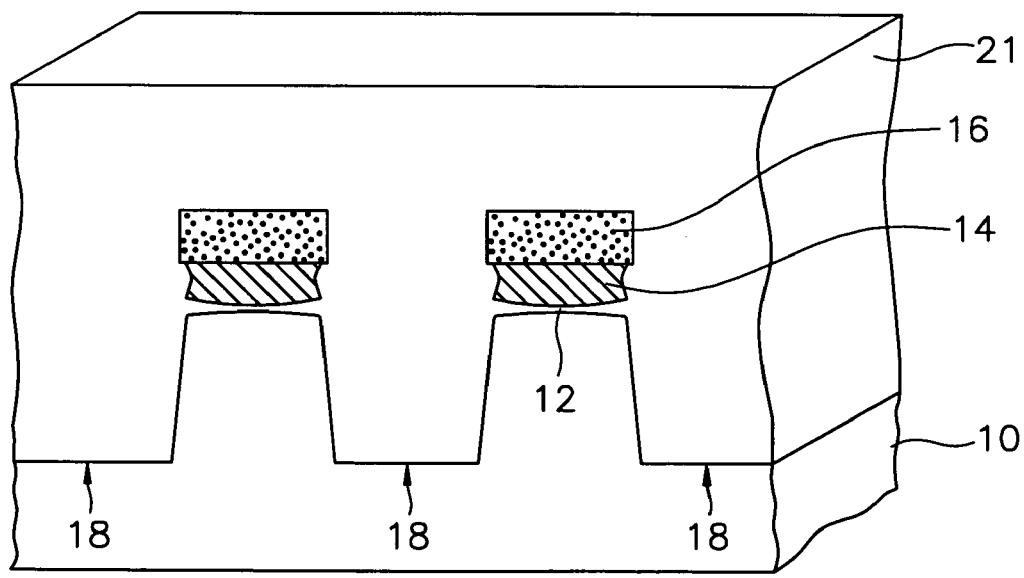
Figure 1E:
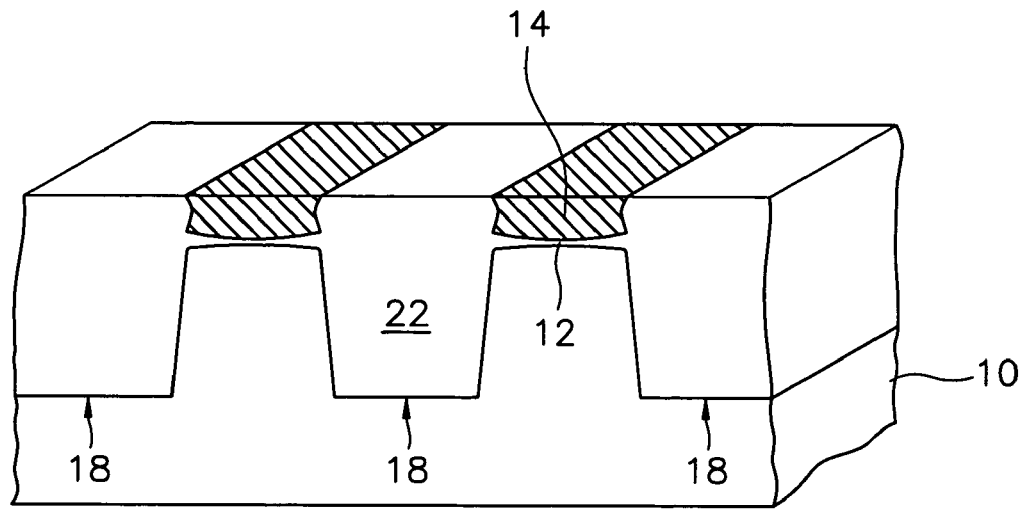
Figure 1F:
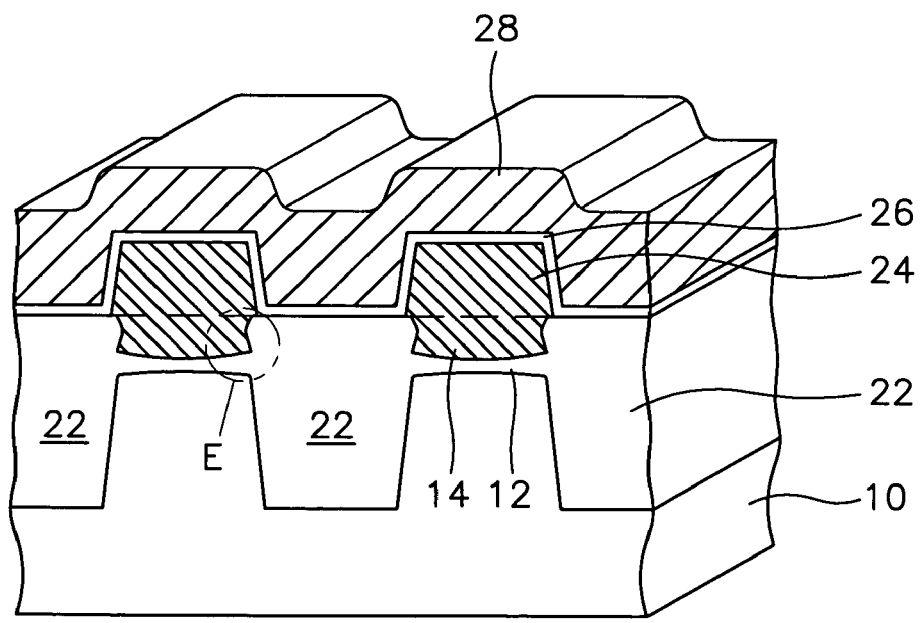
Figure 1G:
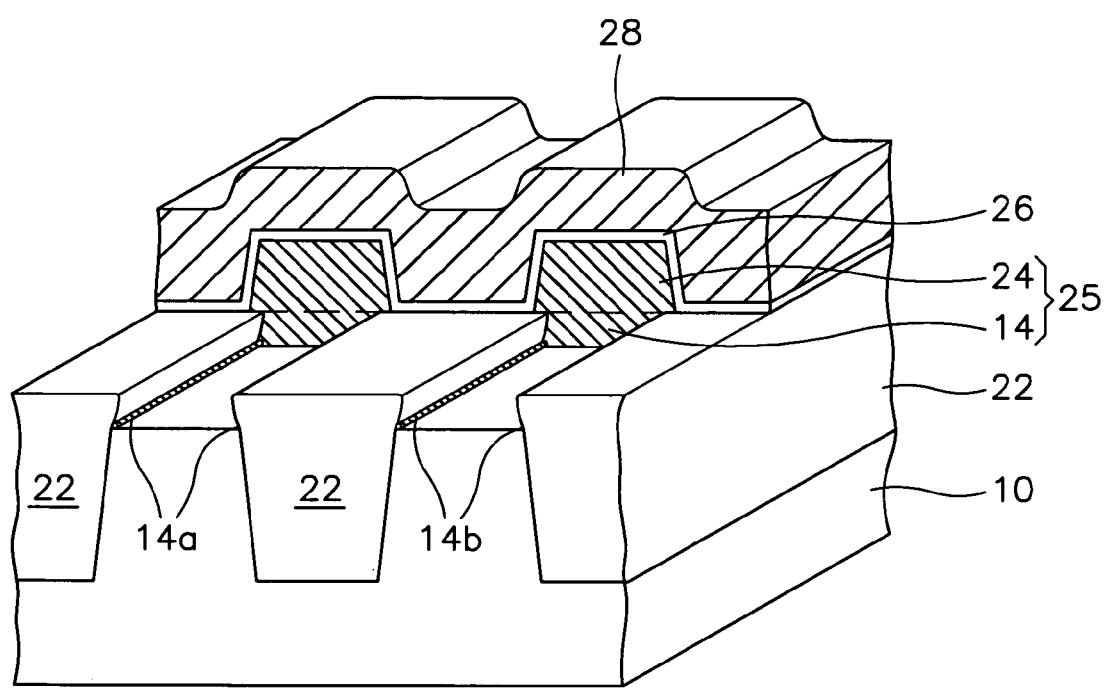
Figure 2:
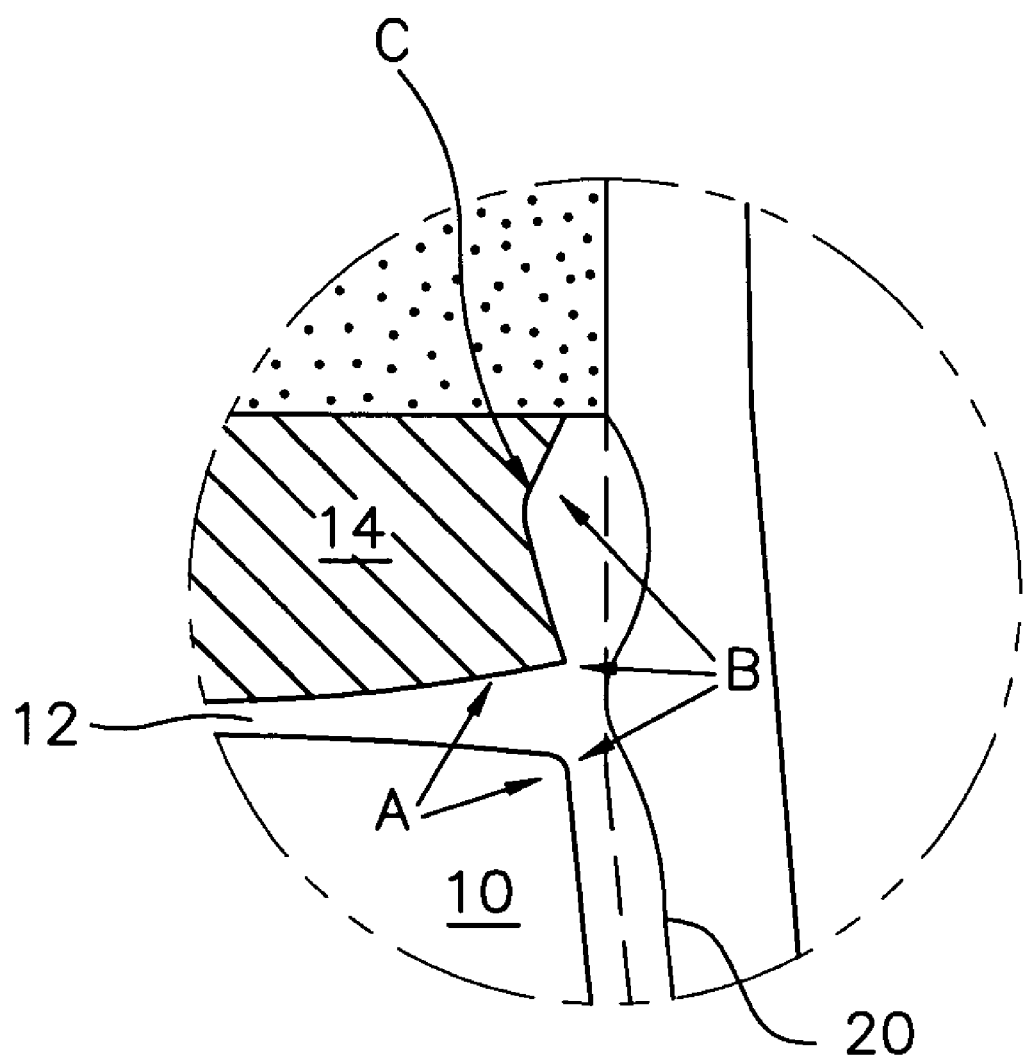
FIG. 2 is an enlarged cross sectional view of the portion labeled 'D' in FIG. 1C.
Figure 3A:
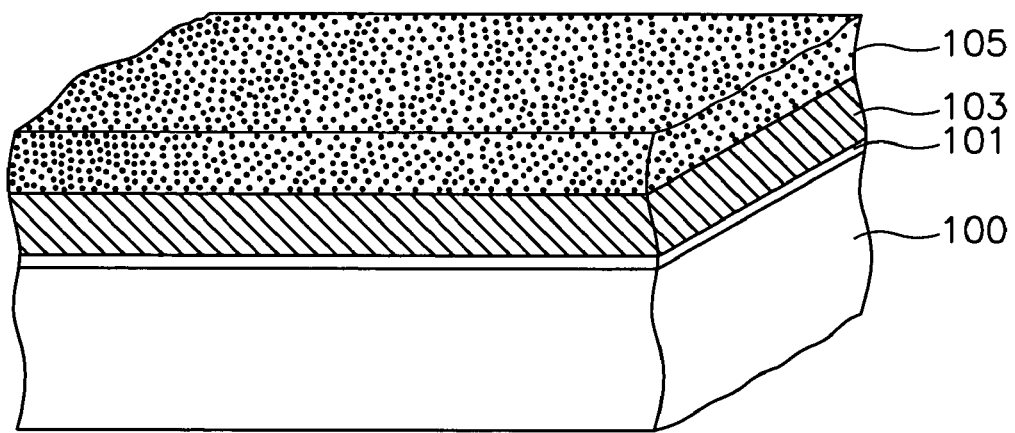
FIGS. 3A to 3H are perspective views illustrating a method of trench isolation and a method for manufacturing a non-volatile memory device according to one embodiment of the present invention.

Referring to FIG. 3A, oxide is deposited on a semiconductor substrate 100 having silicon to form a first oxide layer 101 having a thickness of about 100 Å corresponding to a gate oxide layer or a tunnel oxide layer.

A first conductive layer 103 having a thickness of about 300 Å to about 1,000 Å used as a floating gate is formed on the first oxide layer 101 through a low pressure chemical vapor deposition (LPCVD) process. The first conductive layer 103 is doped with N type impurities with high concentration through a doping process, for example, such as a $POCl_3$ diffusing process, an ion implanting process or an in-situ doping process. The first conductive layer 103 may include polysilicon or amorphous silicon.

A nitride layer 105 having a thickness of about 1,500 Å to about 2,000 Å including silicon nitride is formed on the first conductive layer 103 through a chemical vapor deposition (CVD) process. The nitride layer 105 serves as a mask during a subsequent etching process and also as a polishing stop layer during a subsequent chemical mechanical polishing (CMP) process.

Figure 3B:
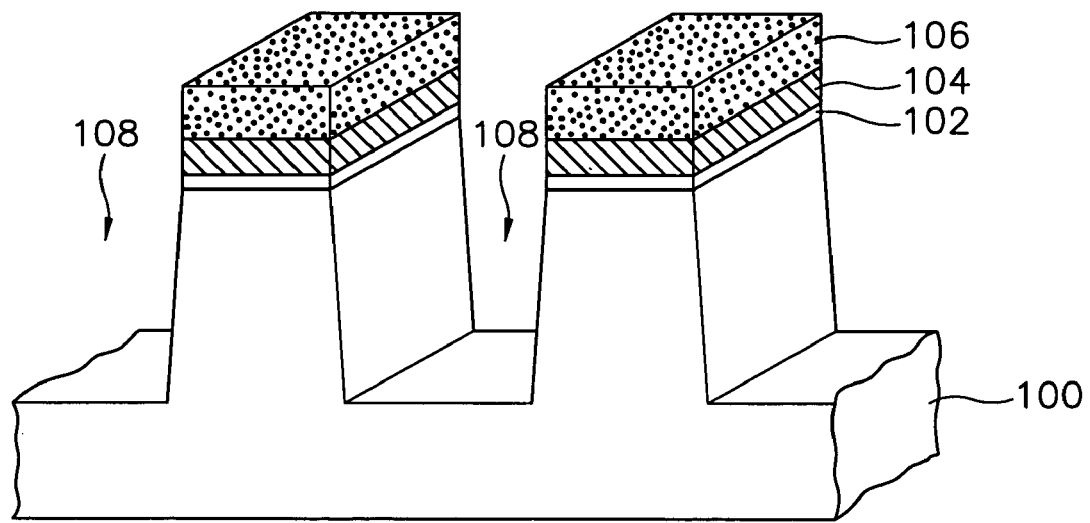

Referring to FIG. 3B, the nitride layer 105 is patterned through a photolithography process to form a nitride layer pattern 106. The first conductive layer 103 and the first oxide layer 101 are dry etched using the nitride layer pattern 106 as a mask for defining the floating gate to form a first conductive layer pattern 104 and a first oxide layer pattern 102.

An upper portion of the substrate 100 adjacent to the first conductive layer pattern 104 is etched by a depth of about 2,000 Å to about 5,000 Å using the nitride layer pattern 106 as a mask to form a trench 108 in the substrate 100. The first conductive layer patterns 104 are divided by the trench 108. In one embodiment, the first conductive layer pattern 104 and the first oxide layer pattern 102 are formed using the nitride layer pattern 106 as the mask. The substrate 100 is etched through a self-alignment process using the mask to form the trench 108. An active region is formed on the substrate 100. Simultaneously, the floating gate is partially formed on the upper portion of the substrate 100. Alternatively, the first conductive pattern 104 and the first oxide layer pattern 102 may be formed using the nitride layer pattern 106 as the mask. The nitride layer pattern 106 may be removed. A mask including a material that has an etching selectivity relative to silicon may be formed on the substrate 100. The substrate 100 may be etched to form the trench 108 in the substrate 100.

Figure 3C:
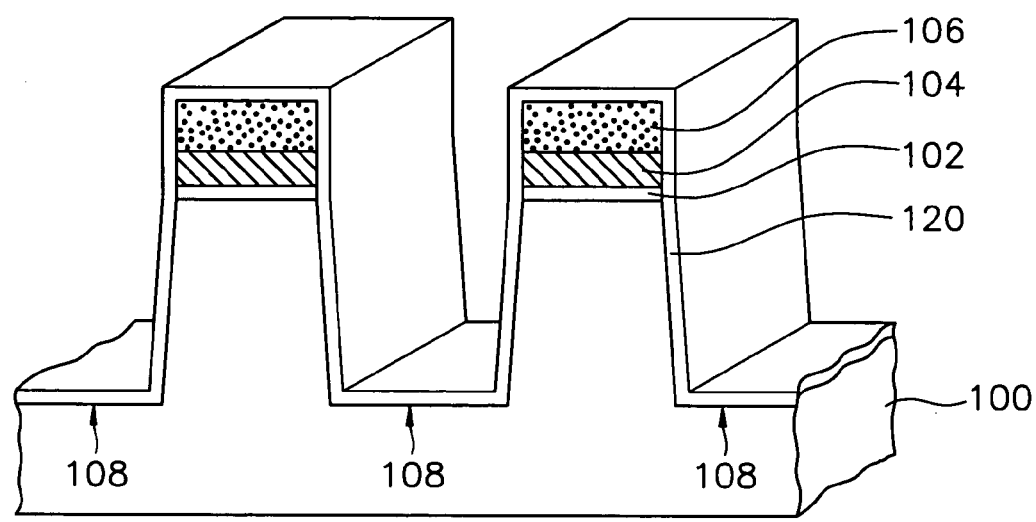
Figure 4:
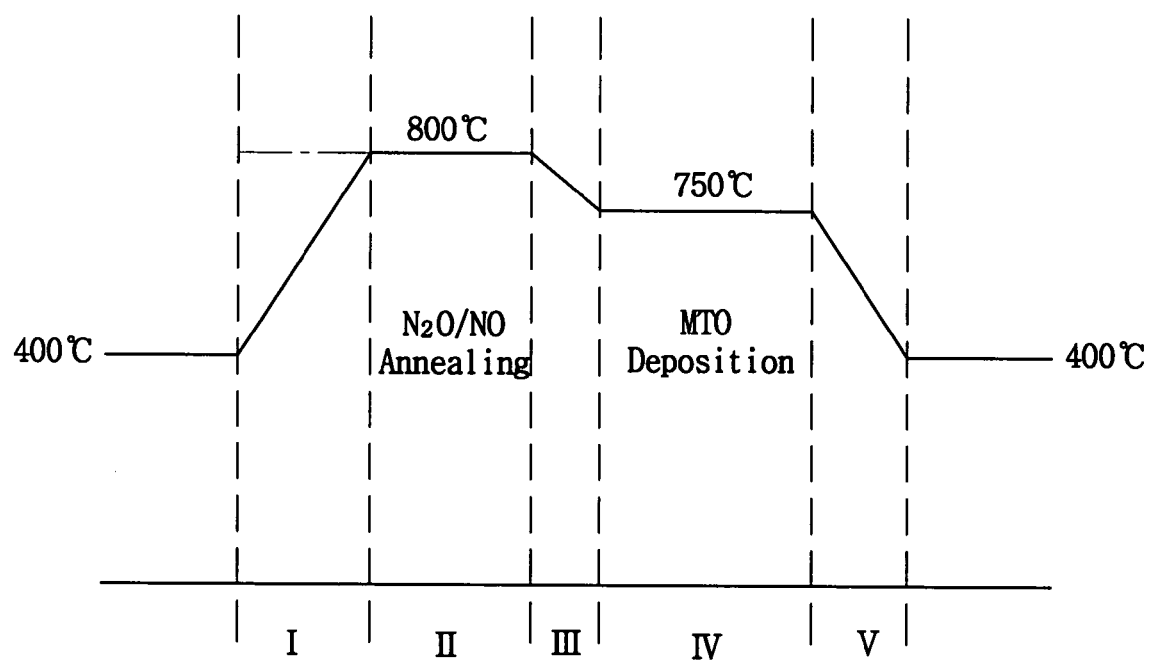
FIG. 4 is a graph illustrating processing conditions of the method according to the present invention.

Referring to FIGS. 3C and 4, the substrate 100 having the trench 108 is annealed using a nitrogen compound including dinitrogen monoxide ($N_2O$) or nitrogen monoxide (NO) to cure inside the trench 108 being damaged during the etching process.

A second oxide layer 120 including a medium temperature oxide (MTO) is formed on the substrate 100 having the nitride pattern 106 through the in-situ process to fill the trench 108 with the second oxide layer 120. The second oxide layer 120 is continuously formed on an upper face of the substrate 100, on a bottom and a sidewall of the trench 108, and on an upper face of the nitride pattern 106. Here, the annealing process is performed at a temperature greater than or equal to about 800° C. The second oxide layer 120 is formed at a thickness of about 140 Å to about 160 Å at a temperature of about 600° C. to about 800° C. The second oxide layer 120 is preferably formed on the bottom and the sidewall of the trench to have a thickness of about 150 Å at a temperature of about 750° C. for about four hours. According to the present invention, since the process for annealing the trench 108 and the process for forming the second oxide layer 120 are performed through the in-situ process, processes for fabricating a semiconductor device may be simplified and time for fabricating a semiconductor device may be reduced. A defect such as a bird's beak may not occur due to the process for forming the trench 108.

Figure 3D:
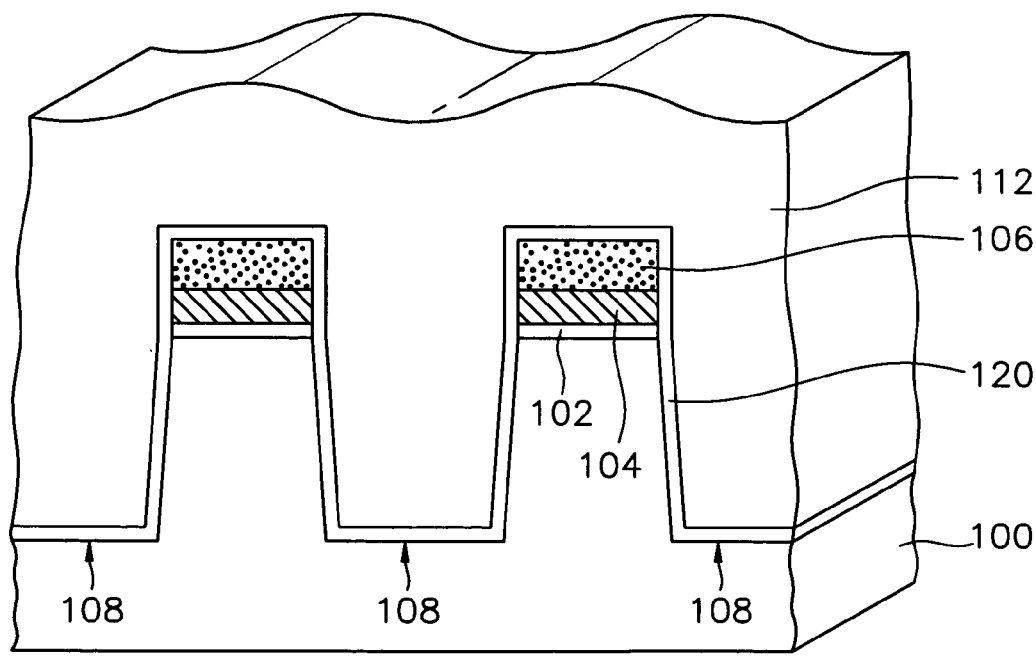

Referring to FIG. 3D, a third oxide layer 112 is formed to have a thickness of about 5,000 Å on the substrate 100 to fill the trench 108 with the third oxide layer 112. The third oxide layer 112 may include borophosphosilicate glass (BPSG), ozone-tetraethylorthosilicate ($O_3$-TEOS), undoped silicate glass (USG) or high density plasma (HDP) oxide having an excellent gap filling characteristic. Here, the third oxide layer 112 covers the nitride layer pattern 106. The third oxide layer 112 may be formed through a HDP process using silane ($SiH_4$) gas, an oxygen ($O_2$) gas and an argon (Ar) gas as a plasma source.

Figure 3E:
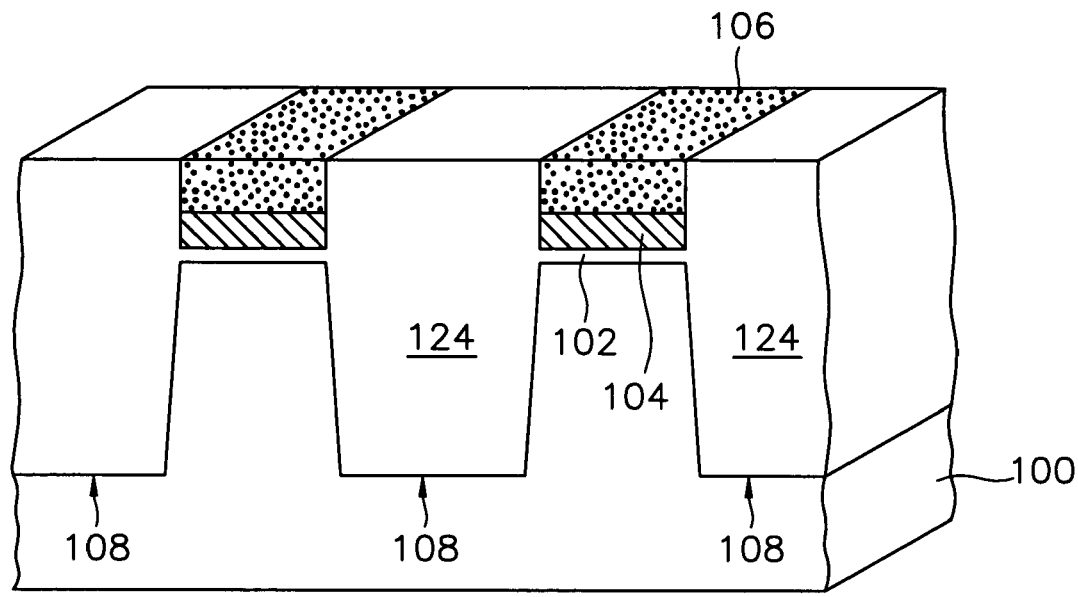

Referring to FIG. 3E, the third oxide layer 112 is removed through the CMP process to expose the upper face of the nitride layer pattern 106 to form a field oxide layer 124 defining the active region in the trench 108.

Figure 3F:
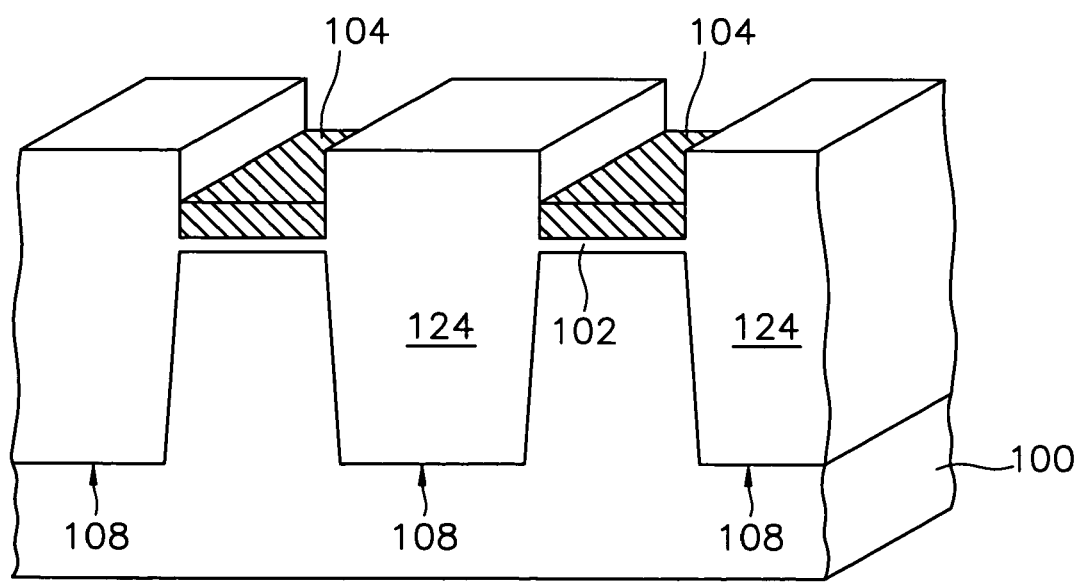

Referring to FIG. 3F, the nitride layer pattern 106 is removed through a stripping process using phosphoric acid to expose the first conductive layer pattern 104. The upper portion of the field oxide layer 124 is projected higher than that of the first conductive layer pattern 104. A pre-cleaning process is performed using an etchant including hydrogen fluoride (HF) for about 30 seconds to rinse particles on the substrate 100. Here, the field oxide layer 124 may be removed by a thickness of above about 250 Å during the stripping process and the pre-cleaning process.

Figure 3G:
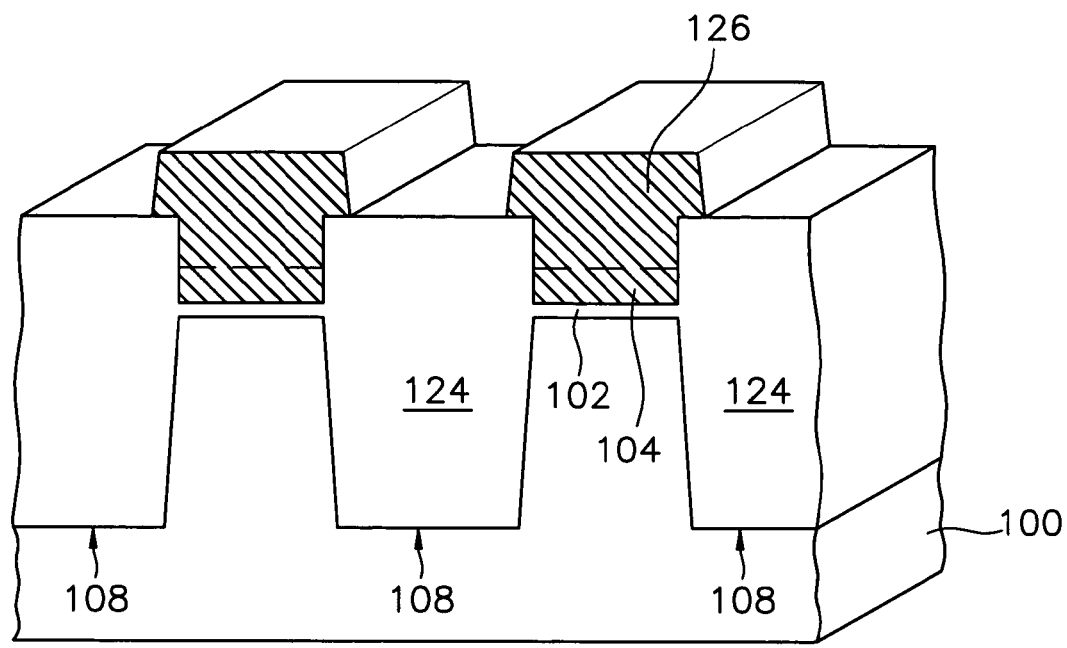

Referring to FIG. 3G, a second conductive layer (not shown) including polysilicon or amorphous silicon is formed on the first conductive layer pattern 104 and the field oxide layer 124 through the CVD process to have a thickness of above about 3,000 Å. The second conductive layer is doped with N type impurities with a high concentration through the phosphorous oxychloride ($POCl_3$) diffusing process, the ion implanting process or the in-situ doping process. Here, the second conductive layer serves as the floating gate and also functions to broaden area of an oxide/nitride/oxide (ONO) layer. Accordingly, the second conductive layer may be preferably formed as thickly as possible. The second conductive layer on the field oxide layer 124 is removed through the photolithography process to form a second conductive layer pattern 126 on the first conductive layer pattern 104. The floating gates 125 including the first and second conductive layer patterns 104 and 126 are formed and are simultaneously divided with each other.

Figure 3H:
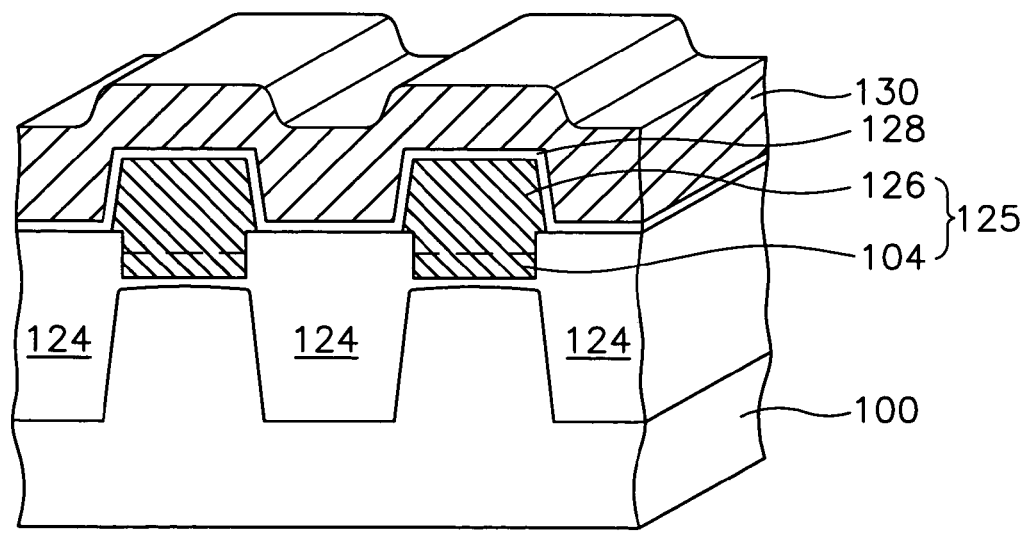

Referring to FIG. 3H, the ONO layer 128 is formed on the substrate 100 having the second conductive layer pattern 126 and the field oxide layer 124. In particular, the second conductive layer pattern 126 is oxidized to form a lower oxide layer having a thickness of about 100 Å to about 150 Å. A nitride layer having a thickness of about 130 Å to about 150 Å is formed on the lower oxide layer. The nitride layer is oxidized to form an upper oxide layer having a thickness of about 40 Å to about 100 Å. As a result, the ONO layer 128 having a thickness of about 100 Å to about 200 Å is formed.

FIGS. 5A to 5G are perspective views illustrating a method of trench isolation and a method for manufacturing a non-volatile memory device according to another embodiment of the present invention.

Figure 5A:
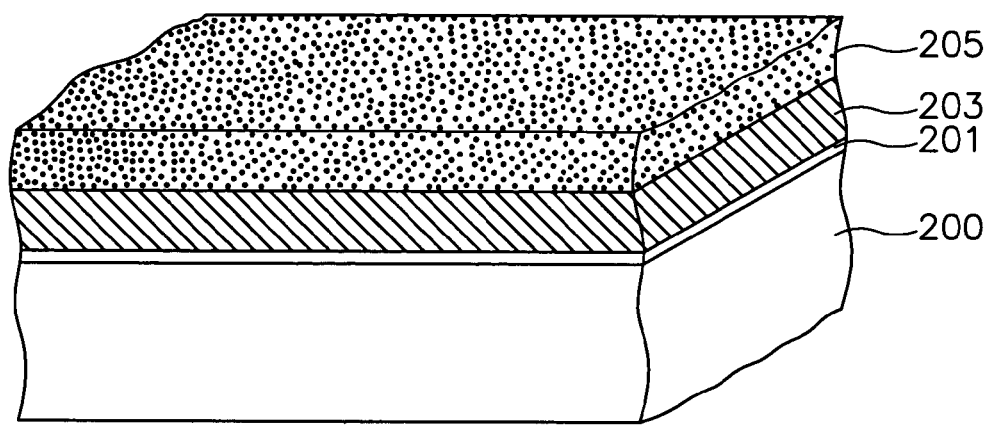
FIGS. 5A to 5G are perspective views illustrating a method of trench isolation and a method for manufacturing a non-volatile memory device according to another embodiment of the present invention.

Referring to FIG. 5A, a first oxide layer 201 having a thickness of below about 100 Å is formed on a semiconductor substrate 200 including silicon through a thermally oxidizing process. The first oxide layer 201 is used for a gate oxide layer or a tunnel oxide layer of a cell transistor.

A first conductive layer 203 used for a floating gate is formed on the first oxide layer 201 through a low pressure chemical vapor deposition (LPCVD) process to have a thickness of about 300 Å to about 1,000 Å. The first conductive layer 203 is doped with N type impurities with high concentration through a doping process, for example, such as a phosphorous oxychloride ($POCl_3$) diffusing process, an ion implanting process or an in-situ doping process. The first conductive layer 203 may include polysilicon or amorphous silicon. A nitride layer 205 having a thickness of about 1,500 Å to about 2,000 Å is formed on the first conductive layer 203 through a chemical vapor deposition (CVD) process.

Figure 5B:
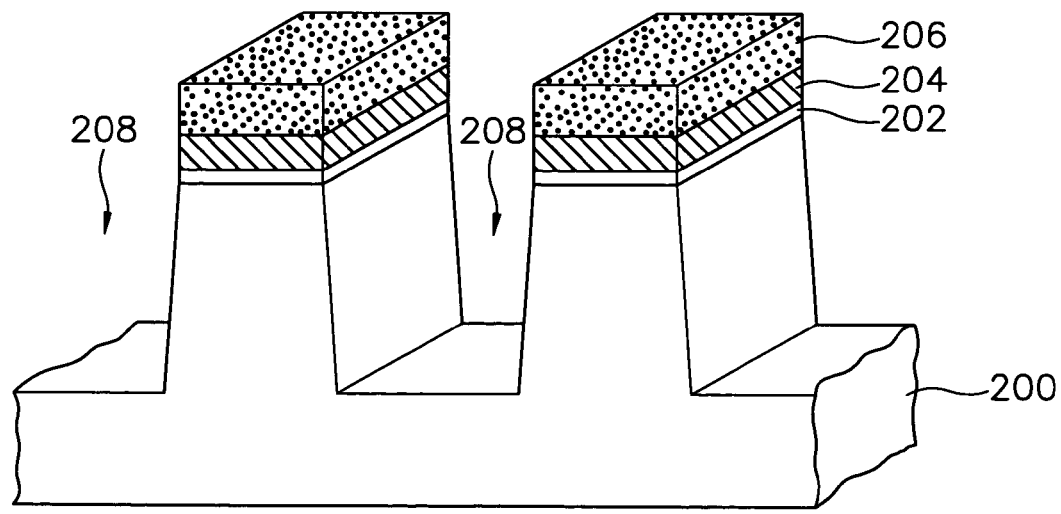

Referring to FIG. 5B, to define the floating gate, the nitride layer 205 is patterned through a photolithography process using a photoresist pattern (not shown) to form a nitride layer pattern 206 used as a mask. After the photoresist pattern is removed, the first conductive layer 203 and the first oxide layer 201 are dry etched using the nitride layer pattern 206 as a mask to form a first conductive layer pattern 204 and a first oxide layer pattern 202. Alternatively, the nitride layer 205, the first conductive layer 203 and the first oxide layer 201 may be sequentially etched to form the nitride layer pattern 206, the first conductive layer pattern 204 and the first oxide layer pattern 202.

An upper portion of the substrate 200 adjacent to the first conductive layer pattern 204 is etched by a depth of about 2,000 Å to about 5,000 Å using the mask to form a trench 208 in the substrate 200. The first conductive layer patterns 204 are divided by the trench 208. In another embodiment, since an active region is formed on the substrate 200 and simultaneously, the floating gate is partially formed on the substrate 200 using the one mask only during formation of the trench 208, the trench 208 may be formed between the active region and the floating gate through a self-alignment process.

Figure 5C:
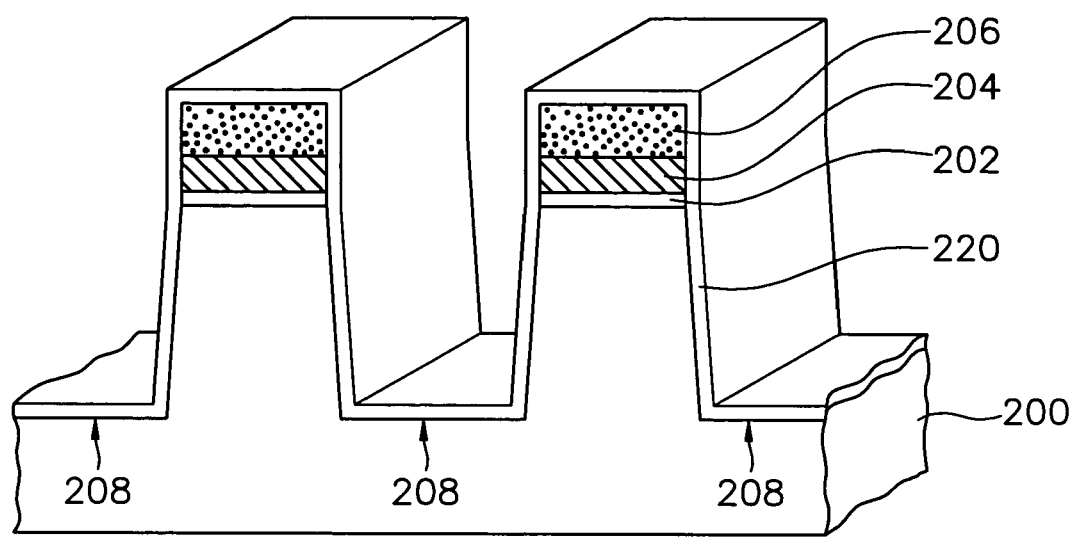

Referring to FIG. 5C, the substrate 200 having the trench 208 is annealed using a nitrogen compound including dinitrogen monoxide ($N_2O$) or nitrogen monoxide (NO) to cure inside the trench 208 being damaged during the etching process. A second oxide layer 220 including a medium temperature oxide (MTO) is formed in the trench 208 and on the nitride pattern 206 through the in-situ process. Here, the annealing process is performed at a temperature of greater than or equal to about 800° C. The second oxide layer 220 is formed to have a thickness of about 140 Å to about 160 Å at a temperature of about 700° C. to about 800° C. The second oxide layer 220 is preferably formed by a thickness of about 150 Å at a temperature of about 750° C. Since the process for annealing the trench 208 and the process for forming the second oxide layer 220 are performed through the in-situ process, processes for fabricating a semiconductor device may be simplified and time for fabricating a semiconductor device may be reduced.

Figure 5D:
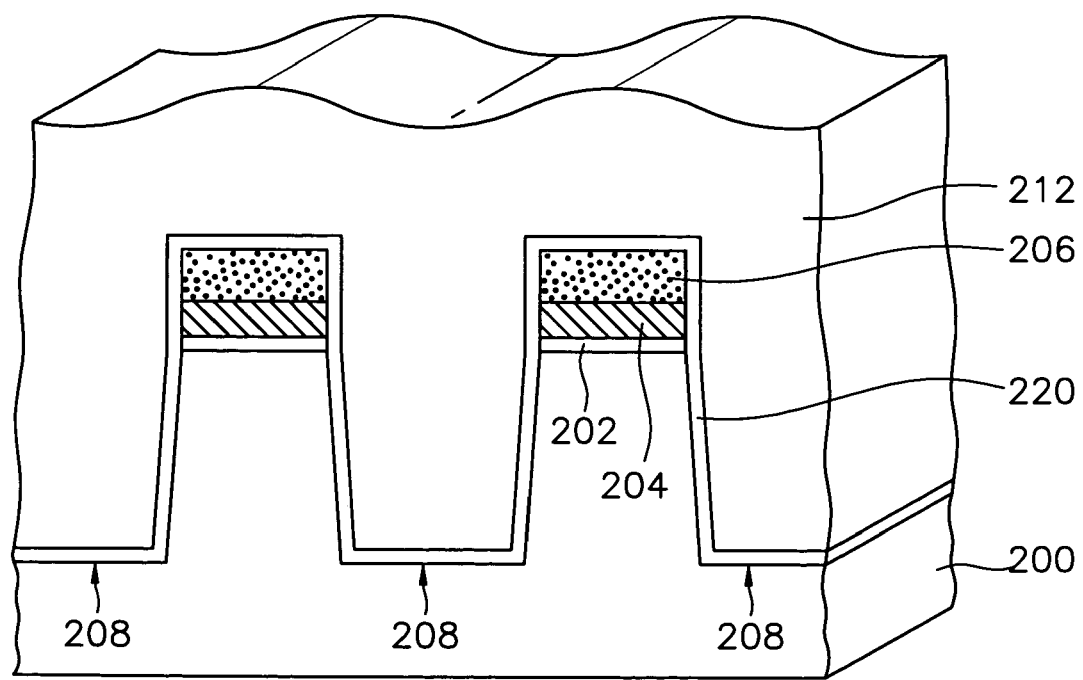

Referring to FIG. 5D, a third oxide layer 212 is formed to have a thickness of about 5,000 Å on the substrate 100 to bury the trench 208 with the third oxide layer 212. The third oxide layer 212 may include BPSG, $O_3$-TEOS, USG or HDP oxide having an excellent gap filling characteristic. Here, the third oxide layer 212 may be formed through a HDP process using silane ($SiH_4$) gas, oxygen ($O_2$) gas and argon (Ar) gas as a plasma source.

Figure 5E:
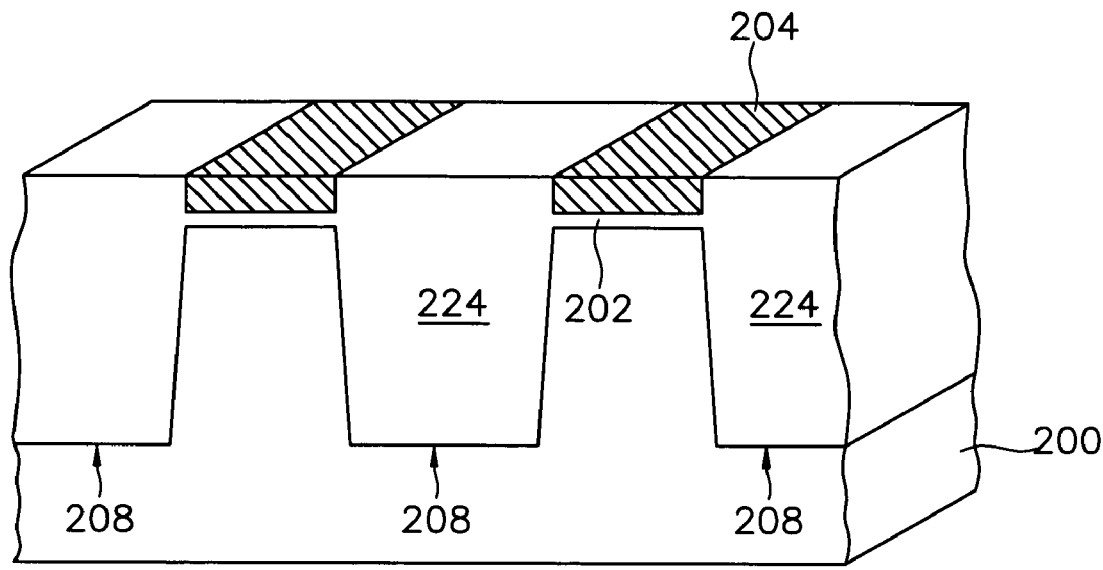

Referring to FIG. 5E, the third oxide layer 212 is removed through a CMP process or an etch-back process for exposing the upper face of the first conductive layer pattern 204 to form a field oxide layer 224 in the trench 208. A pre-cleaning process is performed on the substrate 200 using an etchant including hydrogen fluoride (HF) for 30 seconds.

Figure 5F:
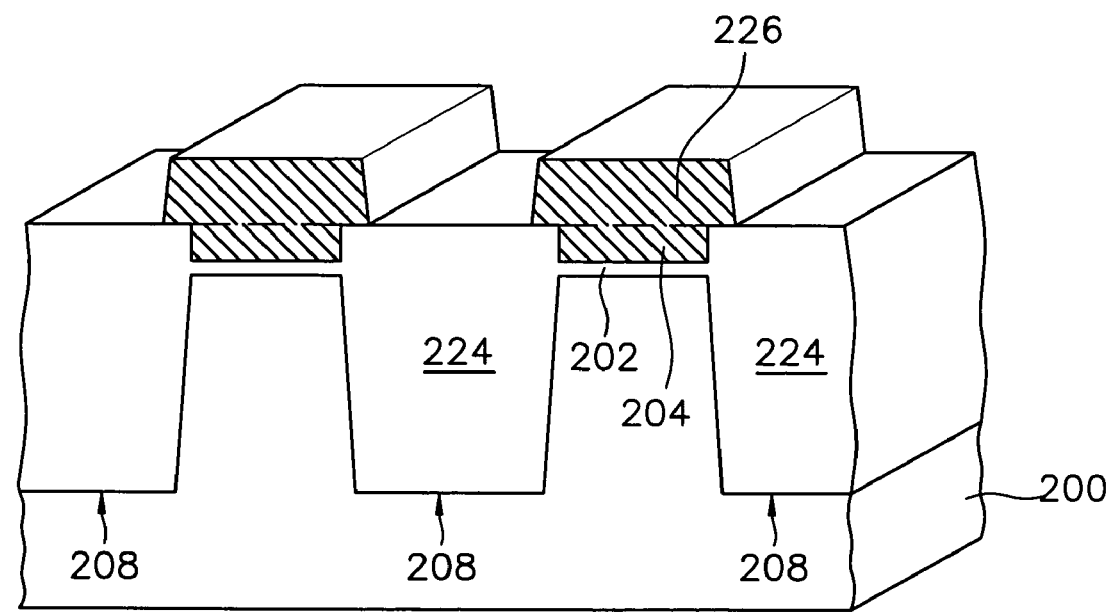

Referring to FIG. 5F, a second conductive layer (not shown) including polysilicon or amorphous silicon is formed on the first conductive layer pattern 204 and the field oxide layer 224 through the CVD process by a thickness of above about 3,000 Å. The second conductive layer is doped with N type impurities with a high concentration through the phosphorous oxychloride ($POCl_3$) diffusing process, the ion implanting process or the in-situ doping process. Here, the second conductive layer serves as the floating gate and also functions to broaden an area of an oxide/nitride/oxide (ONO) layer. Accordingly, the second conductive layer may be preferably formed as thickly as possible. The second conductive layer on the field oxide layer 224 is removed through the photolithography process to form a second conductive layer pattern 226 on the first conductive layer pattern 204. The floating gates including the first and second conductive layer patterns 204 and 226 are formed and are simultaneously divided with each other.

Figure 5G:
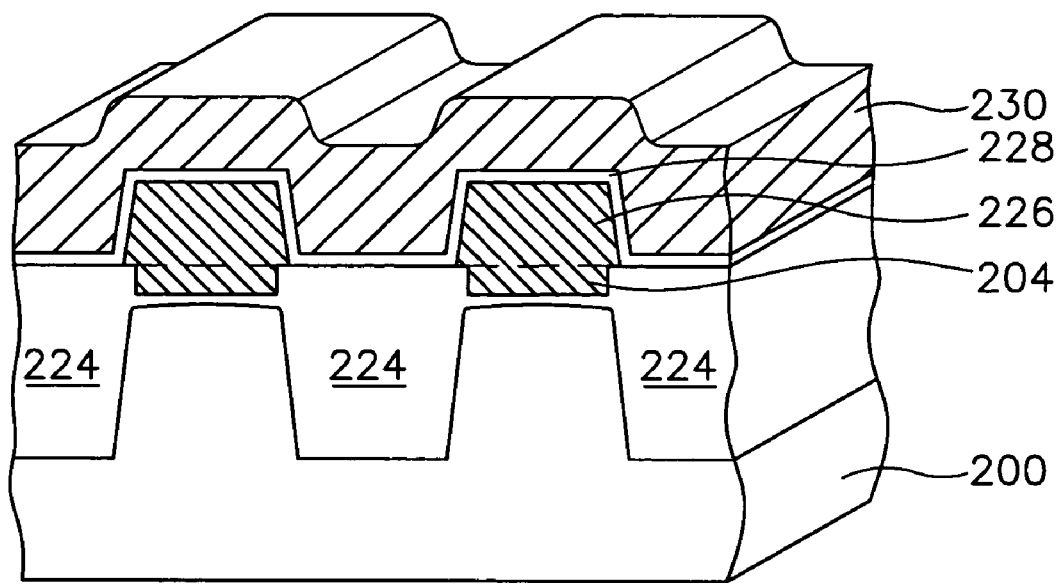

Referring to FIG. 5G, the ONO layer 228 is formed on the substrate 200. In particular, the second conductive layer pattern 226 is oxidized to form a lower oxide layer having a thickness of about 100 Å. A nitride layer having a thickness of about 130 Å is formed on the lower oxide layer. The nitride layer is oxidized to form an upper oxide layer having a thickness of about 40 Å, thereby forming the ONO layer 228.

A control gate including a third conductive layer (not shown) and a metal silicide layer (not shown) are formed on the ONO layer 228. Here, the third conductive layer may include polysilicon doped with $N^+$ type impurities. The metal silicide layer may include tungsten silicide (WSix), titanium silicide (TiSix), or tantalum silicide (TaSix). The third conductive layer may have a thickness of about 1,000 Å. The control gate 230 includes the third conductive layer pattern having a thickness of about 1,000 Å and the metal silicide layer having thickness of about 1,000 Å to about 1,500 Å.

The control gate 230 is etched through the photolithography process to expose the ONO layer 228. The exposed portions of the ONO layer 228, the second conductive layer pattern 226 and the first conductive layer pattern 204 are successively dry etched. As a result, a stacked gate including the floating gate 225 and the control gate 230 is formed on the memory cell region of the semiconductor substrate 200.

According to the present invention, since the trench is annealed under dinitrogen monoxide ($N_2O$) or nitrogen monoxide (NO) atmosphere and then the oxide layer including a medium temperature oxide is formed in the trench through the in-situ process without forming a thermal oxide layer in the trench, a defect such as a bird's beak may not occur. More, since the process for forming the thermal oxide layer may be omitted while the trench annealing process and the oxide layer forming process are performed the in-situ process, time for fabricating the semiconductor device is remarkably reduced.

Having described the preferred embodiments for forming the dielectric layers, it is noted that modifications and variations can be made by persons skilled in the art in light of the above teachings. It is therefore to be understood that changes may be made in the particular embodiment of the present invention disclosed which is within the scope and the spirit of the invention outlined by the appended claims.

What is claimed is:

1. A method of trench isolation comprising:
   forming a first oxide layer on a semiconductor substrate;
   successively forming a first conductive layer and a nitride layer on the first oxide layer;
   etching the nitride layer, the first conductive layer and the first oxide layer to form a nitride layer pattern, a first conductive layer pattern and an oxide layer pattern;
   etching a portion of the substrate adjacent to the first conductive layer pattern using the nitride layer pattern as a mask to form a trench in the substrate;
   curing the trench using a compound including nitrogen;
   forming a second oxide layer on a bottom and a sidewall of the trench; and
   forming a field oxide layer to fill up the trench.

2. The method of claim 1, wherein the trench is formed through a self-alignment process using the nitride layer pattern as a mask.

3. The method of claim 2, wherein the first conductive layer pattern and the oxide layer pattern are formed using the nitride layer pattern as the mask.

4. The method of claim 1, wherein the compound includes at least one of dinitrogen monoxide ($N_2O$) and nitrogen monoxide (NO).

5. The method of claim 1, wherein curing the trench is performed through an annealing process at a temperature of above about 800° C.

6. The method of claim 5, wherein the second oxide layer is formed through an in-situ process.

7. The method of claim 6, wherein the second oxide layer is formed at a temperature of about 700° C. to about 800° C.

8. The method of claim 1, wherein the second oxide layer includes medium temperature oxide.

9. The method of claim 8, wherein the second oxide layer has a thickness of about 140 Å to about 160 Å.

10. The method of claim 1, wherein forming the field oxide layer comprises:
    forming a third oxide layer to fill up the trench and to cover the nitride layer pattern; and planarizing the third oxide layer through a chemical mechanical polishing (CMP) process or an etch-back process to expose an upper face of the nitride layer pattern.

11. The method of claim 10, wherein the third oxide layer includes at least one of borophosphosilicate glass (BPSG), ozone-tetraethylorthosilicate ($O_3$-TEOS), undoped silicate glass (USG) and high density plasma (HDP) oxide.

12. A method for manufacturing a non-volatile memory device comprising:
  forming a first oxide layer on a semiconductor substrate;
  forming a first conductive layer on the first oxide layer;
  forming a nitride layer on the first conductive layer;
  etching the nitride layer, the first conductive layer and the first oxide layer to form a nitride layer pattern, a first conductive layer pattern and an oxide layer pattern;
  etching a portion of the substrate adjacent to the first conductive layer pattern using the nitride layer pattern as a mask to form a trench in the substrate;
  curing the trench using a compound including nitrogen;
  forming a second oxide layer on a bottom and a sidewall of the trench through an in-situ process;
  forming a third oxide layer to fill up the trench and to cover the nitride layer pattern;
  removing the third oxide layer to form a field oxide layer in the trench;
  forming a second conductive layer pattern on the first conductive layer pattern; and
  successively forming an oxide/nitride/oxide layer and a third conductive layer on the second conductive layer pattern.

13. The method of claim 12, wherein the trench is formed through a self-alignment process using the nitride layer pattern as a mask.

14. The method of claim 12, wherein the compound includes at least one of dinitrogen monoxide ($N_2O$) and nitrogen monoxide (NO).

15. The method of claim 12, wherein curing the trench is performed through an annealing process at a temperature of above about 800° C.

16. The method of claim 12, wherein the second oxide layer having a thickness of about 140 Å to about 160 Å includes medium temperature oxide.

17. The method of claim 16, wherein the second oxide layer is formed at a temperature of about 700° C. to about 800° C.

18. The method of claim 12, wherein the first and second conductive patterns correspond to a floating gate, and the third conductive layer corresponds to a control gate.

19. The method of claim 12, wherein, prior to forming the second conductive layer pattern, the third oxide layer is planarized through an etch-back process or a chemical mechanical polishing (CMP) process to expose an upper face of the nitride layer pattern, and the nitride layer pattern is selectively removed to expose an upper face of the first conductive layer pattern.

20. The method of claim 12, wherein, prior to forming the second conductive layer pattern, the third oxide layer is planarized through an etch-back process or a chemical mechanical polishing (CMP) process to expose an upper face of the first conductive layer pattern.

21. The method of claim 12, wherein the third oxide layer includes at least one of BPSG, $O_3$-TEOS, USG and high density plasma (HDP) oxide.

* * * * *